(12) United States Patent
Hedegor et al.

(10) Patent No.: US 6,781,344 B1
(45) Date of Patent: Aug. 24, 2004

(54) BATTERY TESTER AND SORTING APPARATUS

(75) Inventors: Erik W. Hedegor, Abbeville, SC (US); Randy L. Oliver, Greenwood, SC (US); Shingo Sawahara, Minamiashigara (JP)

(73) Assignee: Fuji Photo Film, Inc., Greenwood, SC (US)

( * ) Notice: Subject to any disclaimer, the term of this patent is extended or adjusted under 35 U.S.C. 154(b) by 0 days.

(21) Appl. No.: 10/364,136

(22) Filed: Feb. 11, 2003

(51) Int. Cl.[7] .............................................. H01M 10/46
(52) U.S. Cl. ....................................... 320/106; 209/575
(58) Field of Search ................................. 414/281, 282, 414/284, 285; 320/106, 107, 110, 116; 429/90; 340/636.1; 209/3.2, 3.3, 575

(56) References Cited

U.S. PATENT DOCUMENTS

| | | | |
|---|---|---|---|
| 1,832,948 A | | 11/1931 | Schmidt |
| 2,540,225 A | * | 2/1951 | Wengel et al. ............... 209/575 |
| 3,215,241 A | | 11/1965 | Haefele et al. ................ 194/10 |
| 3,761,806 A | * | 9/1973 | Napor et al. ................. 324/658 |
| 4,363,407 A | * | 12/1982 | Buckler et al. ............... 209/3.3 |
| 4,376,485 A | | 3/1983 | Shah ........................... 209/575 |
| 4,414,566 A | * | 11/1983 | Peyton et al. ................ 382/142 |
| 5,903,154 A | | 5/1999 | Zhang et al. ................ 324/437 |
| 6,337,450 B1 | | 1/2002 | Tanii et al. ................... 209/575 |

* cited by examiner

Primary Examiner—Edward H. Tso
(74) Attorney, Agent, or Firm—McNair Law Firm, P.A.

(57) ABSTRACT

A battery testing and sorting apparatus that includes an upwardly inclined conveyor having a conveyor drive for moving batteries to be tested and sorted. The conveyor includes a battery feeding section disposed along the conveyor for positioning the batteries laterally onto the conveyor so that terminals of the batteries are in a horizontal orientation on the conveyor. A testing section is disposed along the conveyor upstream from the battery feeding section for testing the electrical condition of the batteries as they move along the conveyor. A sorting section is disposed along the conveyor upstream from the testing section for ejecting the batteries from the conveyor according to the electrical condition of the batteries determined by the testing section. In this manner, a battery testing and sorting apparatus is provided for continuously sorting large quantities of batteries into groups based on the electrical condition of the batteries.

30 Claims, 5 Drawing Sheets

BATTERY TESTER AND SORTING APPARATUS

FIELD OF THE INVENTION

The present invention relates to battery testers, and more particularly, to an apparatus for testing and sorting batteries according to their electrical condition wherein simplified conveyance, testing, and sorting mechanisms are provided.

BACKGROUND OF THE INVENTION

The ability to recondition and recycle components from disposable products is becoming increasingly important, not only for environmental concerns, but to reduce manufacturing costs by reusing material. Some of these disposable products require batteries in order to operate, such as a one-time use camera with an integrated flash. During the development process of the camera film from one-time use cameras, the batteries are separated from the camera components and collected, traditionally for proper disposal. As many of the batteries were never used to operate a flash, or did so only a few times, the batteries still maintain a sufficient voltage to complete another round of pictures using a flash. Therefore, it is desirable to be able to sort the batteries according to voltage and recycle good batteries back into the production of new one-time use cameras or other suitable uses, while discarding bad batteries. Thus, the ability to effectively sort large amounts of used batteries in a short period of time for the purpose of reusing batteries with a sufficient voltage is an environmentally friendly and cost saving practice for which there is a substantial need.

Previous attempts to provide a machine capable of sorting batteries have resulted in extremely complicated, and expensive machines with limited sorting abilities. For example, U.S. Pat. No. 1,832,948 discloses a battery testing machine. Batteries are fed into a large complicated rotating carriage structure that cycles the batteries through a voltage testing device. If a battery does not have the correct power or voltage level, it is released, through an elaborate mechanism of cams and catches, into a secondary chute in the disc's rotation for recycling or discarding. This invention is overly complicated for completing the task of sorting batteries according to battery voltage. The invention requires the batteries to be properly positioned on a feed chute so that the positive and negative terminals are in a specific orientation for testing. This is a time consuming and laborious task that defeats the entire purpose of having a machine to quickly sort through large amounts of batteries. Additionally, the machine is designed so that the batteries can only be sorted in to two groups, good and bad, limiting the machines sorting ability.

U.S. Pat. No. 5,903,154 discloses another battery testing device that is adjustable to accommodate for testing different sizes of batteries. This invention also requires batteries to be manually fed into position for testing and is impractical for testing large quantities of batteries. Furthermore, this invention provides no disclosure for sorting the batteries after testing.

U.S. Pat. No. 3,215,241 is another example of a battery testing device directed to testing and dispensing a limited number of batteries through a vending machine type process. The invention is limited to testing whether the batteries have a good charge or a bad charge and does not have the ability to sort batteries into additional categories, nor is there any need given the intended vending purpose of this invention. As such, the invention is incapable of sorting large quantities of batteries into a plurality of categories based on battery voltage.

U.S. Pat. No. 4,376,485 is directed to a method for testing the quality of rechargeable batteries prior to the actual charging operation therefore. The method is performed using a turntable apparatus that carries a series of batteries from a charging station to a testing station and then to an ejection point, the ejection point differing for batteries that do or do not hold a satisfactory charge. Again, this invention is only capable of sorting between good batteries and bad batteries. There is no teaching for sorting used batteries into more than two categories based on battery voltage. Additionally, the batteries must be placed onto the turntable in a specific orientation for the testing station to read the voltage of the batteries. As such, this method and machine is also impractical when it comes to sorting large quantities of batteries for reuse according to the battery voltage.

U.S. Pat. No. 6,337,450 is a type of battery sorting apparatus directed to determining the size, type, and components of used batteries. However, the patent does not teach any method or apparatus for sorting the batteries according to the battery voltage.

Accordingly, an object of the present invention is to provide a mechanically simplified and cost effective apparatus capable of sorting large quantities of used batteries into various categories according to the battery voltage.

Another object of the present invention is to provide a battery sorting and testing apparatus capable of receiving a continuous supply of used batteries for testing the electrical condition of the battery.

Another object of the present invention is to provide a battery sorting and testing apparatus capable of receiving a continuous supply of used batteries for sorting batteries into groups based on the battery's electrical condition.

Still another object of the present invention is to provide a battery sorting and testing apparatus capable of testing the voltage of a battery without requiring a specific orientation for the terminals of the battery.

SUMMARY OF THE INVENTION

The above objectives are accomplished according to the present invention by providing a battery testing and sorting apparatus that includes an upwardly inclined conveyor having a conveyor drive for moving the conveyor to test and sort batteries. The conveyor includes a battery feeding section disposed along the length of the conveyor for positioning the battery laterally onto the conveyor so that terminals of the battery are in a horizontal orientation on the conveyor. A testing section is disposed along the length of the conveyor upstream from the battery feeding section for testing the electrical condition of the battery. A sorting section disposed along the length of the conveyor upstream from the testing section is operatively associated with the testing section for ejecting the battery from the conveyor according to the electrical condition of the battery determined by the testing section. In this manner, a battery testing and sorting apparatus is provided for continuously sorting large quantities of batteries into groups based on the electrical condition of the battery.

In a further advantageous aspect, the apparatus includes a control unit for controlling the conveyor drive and general operation of the apparatus. Additionally, position sensors are provided for detecting the position of the battery on the conveyor at the battery feeding section. The control unit receives position signals from the position sensors as to the battery's position on the conveyor before advancing the conveyor to receive another battery. In the event of a jam or other misalignment of a battery being fed onto the conveyor, the control unit will stop the conveyor drive and prevent damage to the apparatus. A battery feeder is disposed alongside the conveyor for delivering the batteries onto the conveyor.

In an advantageous aspect of the invention, the conveyor includes a plurality of cleats extending outward from the conveyor. The cleats are spaced apart to allow only a single battery to be received on the conveyor at the battery feeding section between any two of the cleats. A cleat sensor is disposed along the conveyor for sensing the passing of cleats to determine if the spacing between the cleats exceeds a designated distance so that the batteries are prevented from improperly feeding onto the conveyor or being improperly ejected from the conveyor.

A battery tester is disposed at the testing section for contacting the battery and generating a test signal for the battery being tested. The control unit receives the test signal from the battery tester to determine the electrical condition of the battery. Next, the control unit signals the conveyor drive to advance the battery on the conveyor to an ejector in the sorting section. The control unit signals the ejector in the sorting section to eject the battery from the conveyor when the battery is in position.

An ejector is disposed along the conveyor at the sorting section for ejecting batteries from the conveyor based on the electrical condition of the battery determined at the testing section. The control unit receives a test signal from the testing section and registers the electrical condition of the battery being tested and signals the conveyor drive to advance the batteries on the conveyor to an ejector in the sorting section. The control unit signals the ejector to eject the battery from the conveyor when the battery is in position for ejection.

BRIEF DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein.

DETAILED DESCRIPTION OF A PREFERRED EMBODIMENT

Figure 1:
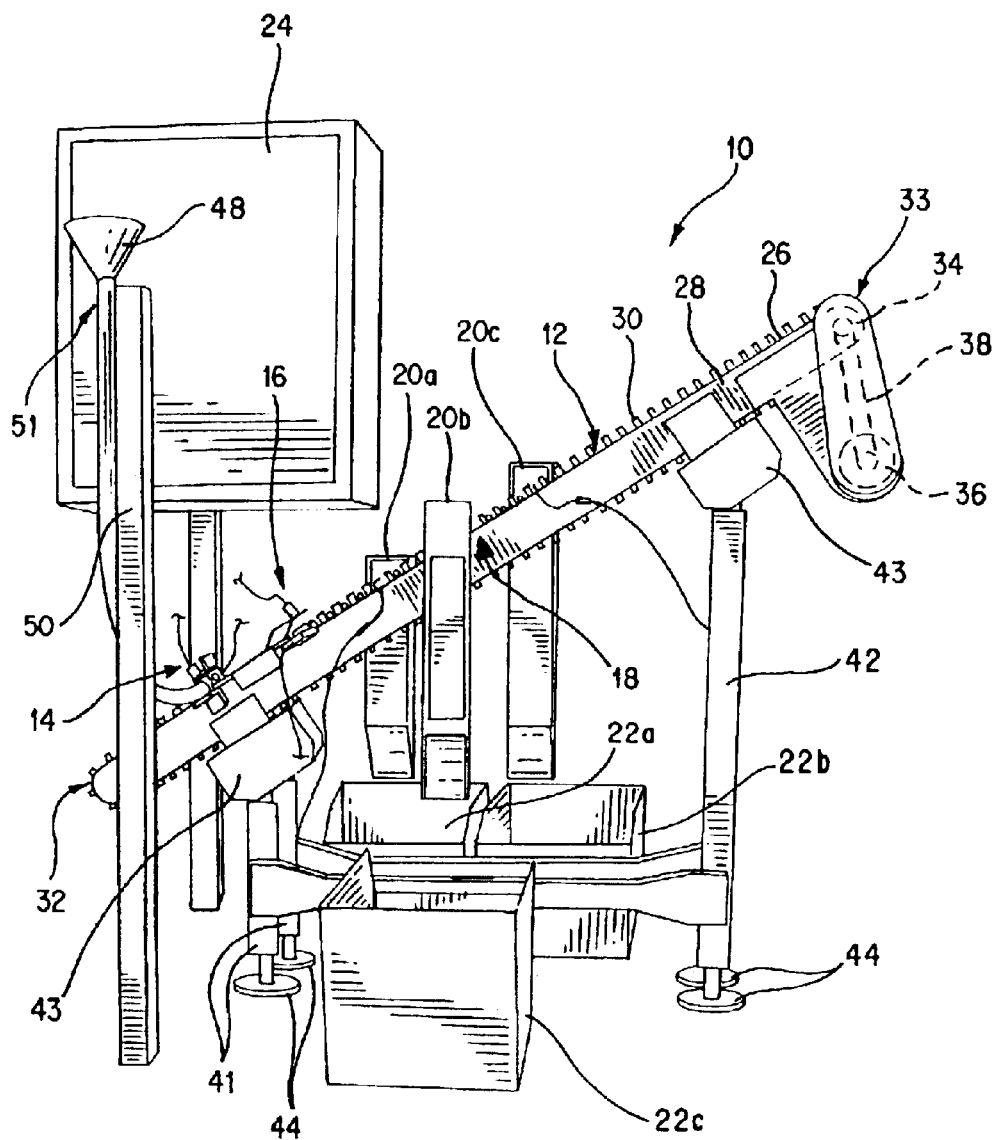
FIG. 1 shows a perspective view of a battery testing and sorting apparatus according to the invention.

Referring now to the drawings, the invention will be described in more detail. Referring to FIG. 1, a battery testing and sorting apparatus, designated generally as 10 and hereinafter referred to as the "sorter", is shown for testing the electrical condition of a battery and sorting the battery into a grouping according to its electrical condition. Preferably, as best illustrated in FIG. 1, the apparatus is constructed and arranged to receive a series of batteries in a continuous manner so that large quantities of batteries can be tested and sorted into groups based on battery voltage. While the batteries may be sorted according to any number of electrical conditions and characteristics, for purposes of the preferred embodiment described herein, however, the sorter will test for battery voltage.

The sorter includes an upwardly inclined conveyor, designated generally as 12, which receives the batteries and moves them for testing and sorting. In the preferred embodiment, the conveyor is divided into three main sections that include a battery feeding section, designated generally as 14, a testing section, designated generally as 16, and a sorting section, designated generally as 18. In this advantageous arrangement, batteries are fed onto the conveyor at the battery feeding section and moved into the testing section in a continuous manner so that the battery voltage can be determined. Once the battery has been tested, it continues to move along the conveyor into the sorting section where it is ejected from the conveyor based on its electrical condition (preferably voltage) into one of chutes 20a, 20b, or 20c, and collected in bins 22a, 22b, and 22c. The advancement of the conveyor, testing of the batteries, and ejecting of the batteries is all controlled through a control unit 24, which monitors the various components of the sorter to properly convey and sort the batteries as is described in detail below.

Continuing to refer to FIG. 1, in the preferred embodiment, conveyor 12 includes a conveyor belt 26, which cycles around conveyor frame 28. Preferably, each end of the conveyor frame, designated generally as low-end 32 and high-end 33, includes a toothed gear (not pictured) for turning the conveyor belt. The bottom side of the conveyor belt includes complimentary teeth 34 (FIG. 2) that are received by the gears to move the conveyor belt. As shown in FIG. 1, the gear carried at conveyor end 33 of the conveyor frame is connected to a conveyor drive 36 by a drive belt 38. Conveyor drive 36 is activated by signals from control unit 24, which turns drive belt 38 to rotate gear 34 and move conveyor belt 26 around the conveyor frame to move the batteries. Preferably, conveyor drive 36 is an electric motor of sufficient power to rotate conveyor belt 26 around conveyer frame 28.

In the preferred embodiment of FIG. 1, the conveyor belt includes a plurality of cleats 30 extending outwardly from the conveyor belt. The cleats are spaced apart approximately 1.5 times the diameter of the battery size being tested, which is sufficient to allow the batteries to feed onto the conveyor so that only a single battery is placed between any two cleats without the batteries having to fit tightly between the two cleats. It will be immediately apparent to those skilled in the art the need for the toothed gears and toothed conveyor belt in order to prevent the conveyor belt from possibly slipping. Any slippage could cause the cleats on the conveyor belt to become misaligned and fail to properly receive the batteries between the cleats at the battery feeding section or properly eject the batteries from the conveyor belt at the sorting section.

Figure 2:
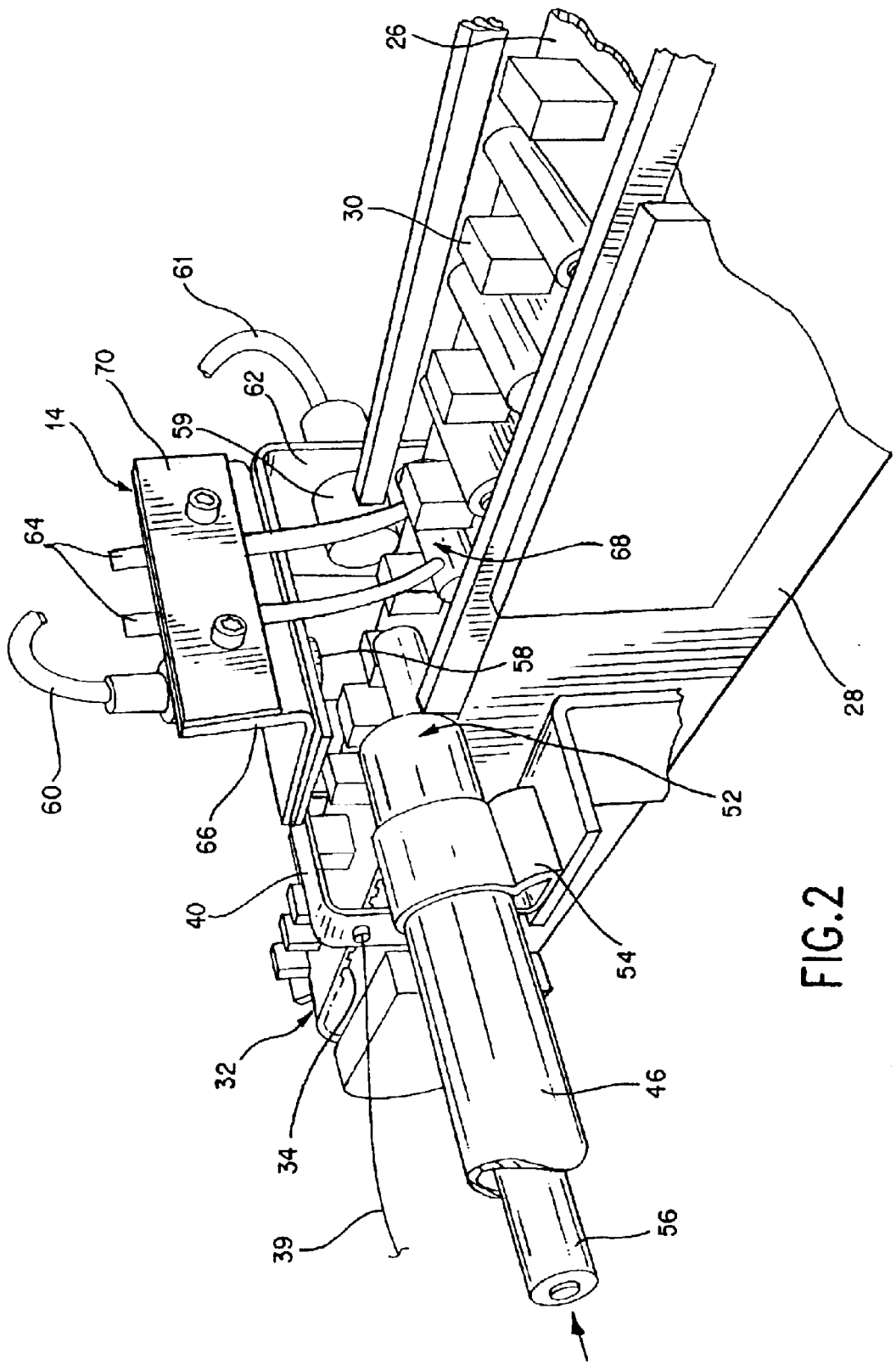
FIG. 2 shows a close-up perspective view of the battery feeding section according to the invention.

Referring to FIG. 2, to prevent such a misalignment, a cleat sensor 40 is disposed along the conveyor and operatively associated with control unit 24. The cleat sensor senses the passing of cleats and generates a cleat signal for each passing cleat. Preferably, the cleat sensor is an optical beam sensor that detects the passing of cleats through the beam. The control unit receives the cleat signal from the cleat sensor through wire 39 and determines the spacing between the cleats. If the control unit does not detect a following cleat through the cleat sensor within 1.5 times the normal cleat spacing, or other designated distance that takes into account the speed of the conveyor, the control unit will signal the conveyor drive to stop the advancement of the conveyor, signal an alarm condition, and allow for visual inspection by the user so that the batteries are prevented from improperly feeding onto the conveyor or being improperly ejected from the conveyor. In the event the control unit does stop the conveyor drive, the cause for the abnormal spacing would likely be a broken cleat or a slipping belt. Preferably, upon startup of the sorter, the control unit will signal the conveyor drive to jog the conveyor belt forward to read the distance between the back edge of a first tooth and the back edge of a second tooth. This will allow the control unit to determine the current position of the cleats on the conveyor belt and ensure that the cleats are aligned to property receive the batteries between the cleats.

Advantageously, the conveyor belt is inclined so that gravity can be used to maintain the batteries in position against the conveyor belt cleats as the batteries are moved from the feeding section to the testing and sorting sections. As the conveyor is often started and stopped, this configuration prevents the batteries from rolling forward each time the conveyor stops and reduces the chance of a battery falling off the conveyor or becoming misaligned for testing or sorting. In order to provide the inclined arrangement for the conveyor, conveyor frame 28 is supported by a pair of low-end support legs 41, and a pair of high-end support legs 42, which angle the conveyor in an upward direction. As shown in FIG. 1, low-end support legs 41 are shorter in comparison to support legs 42 such that the conveyor is maintained at approximately a 30° angle. However, the angle of the conveyor can be maintained at any angle between 25° and 50° and still work properly. Support legs 41 and 42 are affixed to conveyor frame 28 by a bracket 43. In the preferred embodiment, the conveyor is angled so that the battery feeding section is disposed at a lower inclination on the conveyor than the testing and sorting sections in order to prevent forward rolling of the batteries by gravity. Preferably, the support legs include adjustable footings 44 to level the sorter and eliminate any imbalance.

Referring to FIG. 2, the battery feeding section will now be described in more detail. In the preferred embodiment, the battery feeding section 14 is disposed along the length of the conveyor near low-end 32 of the conveyor for positioning the batteries 56 laterally onto the conveyor so that terminals of the batteries are in a horizontal orientation on the conveyor. To position the batteries laterally, the battery feed section includes a battery feeder. Although the battery feeder could be one of any number of means commonly known in the art, for purposes of the preferred embodiment described herein, the battery feeder is a translucent feed tube 46. The feed tube uses gravity to feed the batteries through the tube in a single file continuous manner and place them on the conveyor between cleats 30, as shown in FIGS. 1 and 2. The feed tube includes a funnel 48 for receiving a batch of batteries and funneling the batteries into the feed tube. The funnel end of the feed tube, designated generally as 51, is carried by an elongated vertical post 50 that provides the gravity feed necessary to push the batteries though feed tube 46 and onto the conveyor belt. The opposite end of the feed tube, the feed end, designated generally as 52, is disposed along conveyor belt 26 and affixed in place by a retaining bracket 54 so that the batteries feed out of the tube and slide laterally into place on the conveyor. In order for a single battery to move out of the feed end 52 of the feed tube onto the conveyor, there must be at least two or three batteries behind the battery being fed so that there is sufficient force to push the battery entirely out of the feed tube. As long as a sufficient supply of batteries is maintained in the feed tube, the conveyor can continuously receive batteries and move them to the testing and sorting sections.

Figure 5:
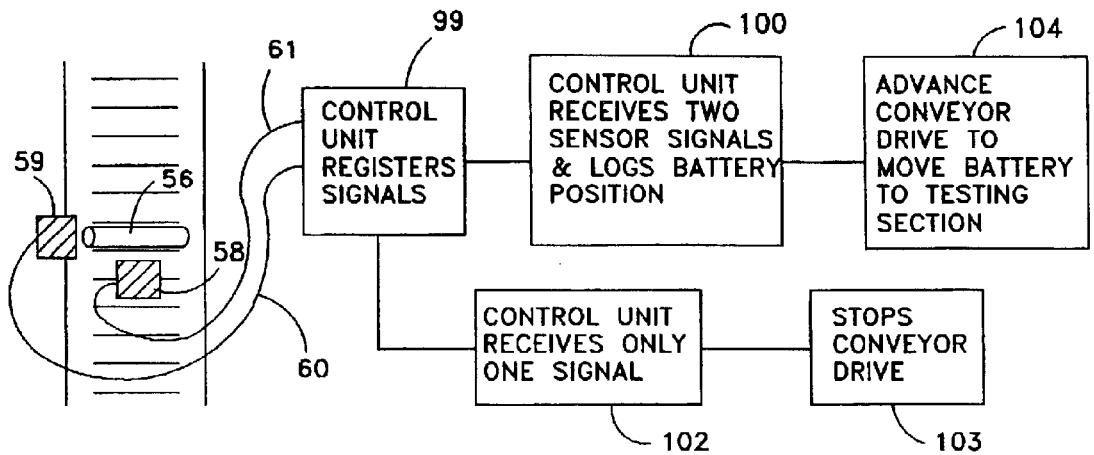
FIG. 5 shows a flow chart depicting the process of feeding batteries onto the conveyor according to the invention.

Referring to FIGS. 2 and 5, the battery feeding section includes position sensors for detecting the position of the battery as it is fed onto the conveyor. The position sensors provide position signals to control unit 24, which confirms the battery is in proper position on the conveyor before advancing the conveyor to receive another battery. The position sensors include a first feed sensor 58 disposed above the conveyor and adjacent feed tube 46. The position sensors also include a second feed sensor 59 disposed alongside the conveyor directly across from feed end 52 of feed tube 46. The position sensors are carried by a first L-shaped bracket. 62 affixed to conveyor frame 28. Bracket 62 extends upward and horizontally across the conveyor, which provides a mounting platform for placing the position sensors on the side and above the conveyor belt. The first and second feed sensors provide position signals to control unit 24 through wires 60 and 61. First feed sensor 58 and second feed sensor 59 are operatively associated with the control unit for controlling the conveyor drive. The control unit signals the conveyor drive to advance the conveyor only upon receiving a first position signal from first feed sensor 58 and a second position signal from said second feed sensor, indicating that the battery is completely removed from said battery feeder and it is safe to advance the conveyor drive. Preferably, the position sensors are proximity detectors that register the presence of a battery within a designated range. In operation, a battery is fed out of the feed tube with a sufficient force to slide across the conveyor belt and contact second feed sensor 59. Second feed sensor 59 requires the battery to be in extremely close proximity (within ⅛") to the sensor in order for control unit 24 to register the presence of a battery. As best shown in FIG. 5, control unit 24 registers the signals 99 from first and second sensors 58 and 59, respectively. When both feed sensors 58 and 59 signal control unit 24, the control unit 24 will log the position of the battery 100 and signal conveyor drive 36 to advance the conveyor 104. If only one of the position sensors signals control unit 24 to register the presence of a battery 102, the control unit will signal conveyor drive 26 to stop 103, and sound an alarm indicating a problem at the battery feeding section. In this situation, a battery is most likely halfway out of the tube because there are less than two batteries behind the battery being fed onto the conveyor.

Additionally, the battery feeding section includes a pair of seating members 64 carried by a second L-shaped bracket 66 mounted atop first L-shaped bracket 62. As best shown in FIG. 2, the seating members are held in place on bracket 66 by a face plate 70, which presses against bracket 66 and sandwiches the seating members to hold them in place. The seating members extend down towards the conveyor belt to catch the batteries moving on the conveyor and make sure that the batteries are properly seated against cleats 30 and aligned laterally across the conveyor and not crooked. Preferably, the seating members are flexible prongs made of metal or plastic that extend to contact the top side of the batteries, designated generally as 68, and bend to allow the batteries to pass underneath the seating members.

Figure 3:
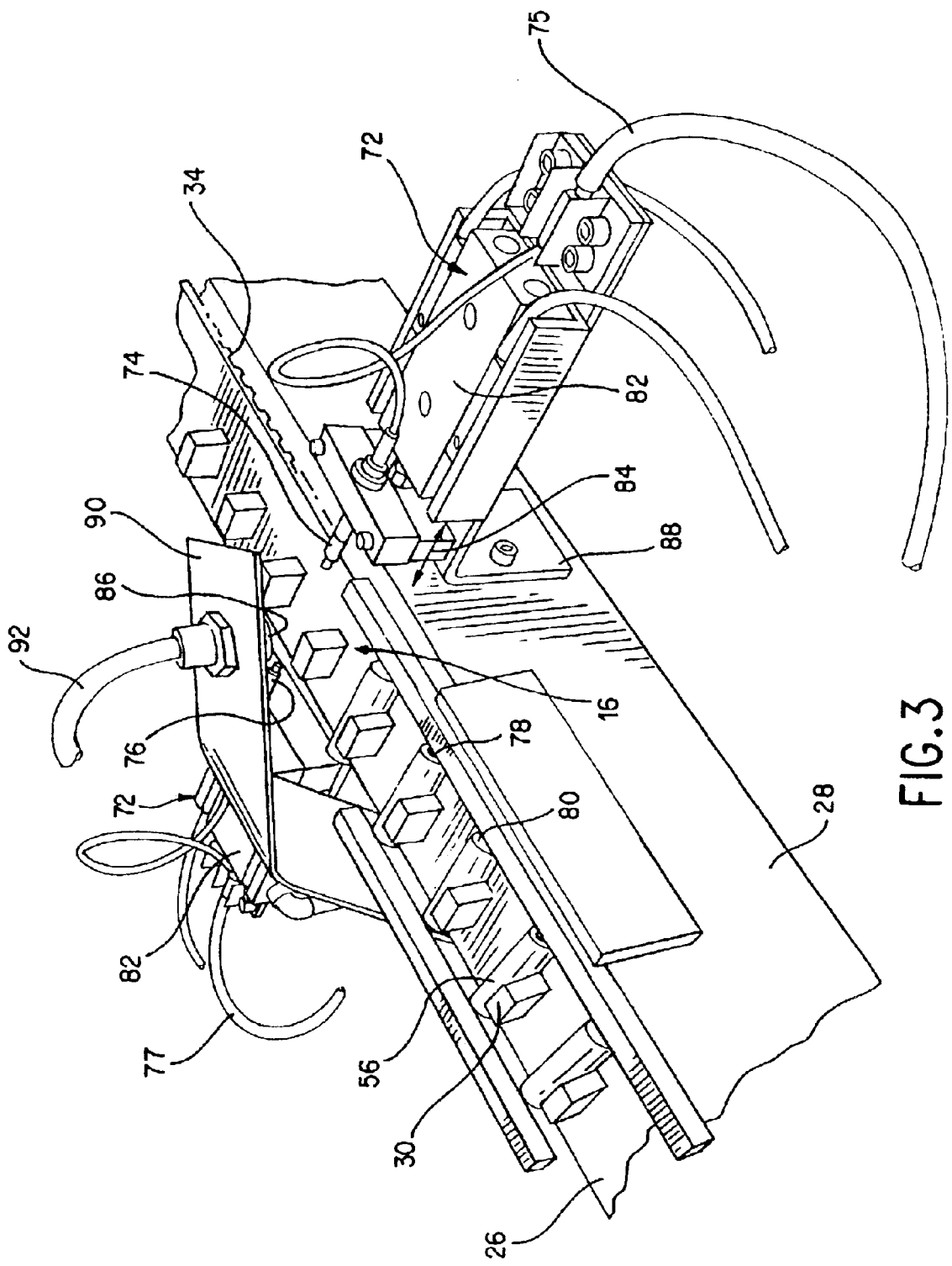
FIG. 3 shows a close-up perspective view of the testing section according to the invention.

Referring to FIG. 3, the testing section will now be described in more detail. In the preferred embodiment, testing section 16 is disposed along the length of the conveyor upstream from the battery feeding section for testing the electrical condition of the battery. The testing section includes a battery tester for contacting the batteries moving along the conveyor and generating a test signal for the, battery being tested. In the preferred embodiment, the battery tester includes a probe assembly, designated generally as 72, for contacting the terminals on the battery and generating the test signal. The probe assembly is connected to control unit 24 for determining the battery's electrical condition. Control unit 24 receives the test signal from the probe assembly through wires 75 and 77 to determine the electrical condition of the battery. Once the battery has been tested and registered by the control unit, the control unit signals the conveyor drive to advance the battery on the conveyor to an ejector located in the sorting section. The control unit then signals the ejector to eject the battery from the conveyor when the battery is in position for ejection.

Preferably, the probe assembly includes a first probe 74 disposed alongside the conveyor for contacting one terminal 78 of the battery, and a second probe 76 disposed alongside the conveyor, opposite first probe 74, for contacting the opposite terminal 80 of the battery to generate the test signal and allow the control unit to read the electrical condition of the battery. Advantageously, the control unit reads the battery's electrical condition without deference to the horizontal orientation of the positive terminal and negative terminal of the battery on the conveyor. This allows for batteries to feed onto the conveyor without aligning the terminals in a specific orientation for testing. Preferably, the probes are operated using a 24-volt pneumatic solenoid 82 that causes probes 74 and 76 to move in a reciprocating manner, designated generally by arrows 84, so that the probes are extended to contact a battery for testing, and then retract to allow the battery to continue down the conveyor. In the preferred embodiment, the probes are able to cycle at a rate of one cycle per second. As best shown in FIG. 3, probe brackets 88 are mounted to conveyor frame 28 to carry probes 74 and 76 and pneumatic solenoids 82 so that the probes are positioned alongside the conveyor to be able to contact the battery terminals for the size of battery being tested.

Additionally, the testing section includes a proximity detector 86, of the same type used in the battery feeding section, for detecting the presence of a battery in the testing section. Referring to FIG. 3, the proximity detector is carried by a mounting bracket 90, which extends above the top of conveyor belt 26. Proximity detector 86 is positioned in mounting bracket 90 in a central location above conveyor belt 26 in order to detect the presence of a battery in the probe assembly and between probes 74 and 76. In operation, control unit 24 receives a proximity signal from the proximity detector through wire 92, registering the presence of a battery in the testing section. The control unit then signals the probe assembly to cycle the probes and test the battery upon receiving the proximity signal.

Figure 4:
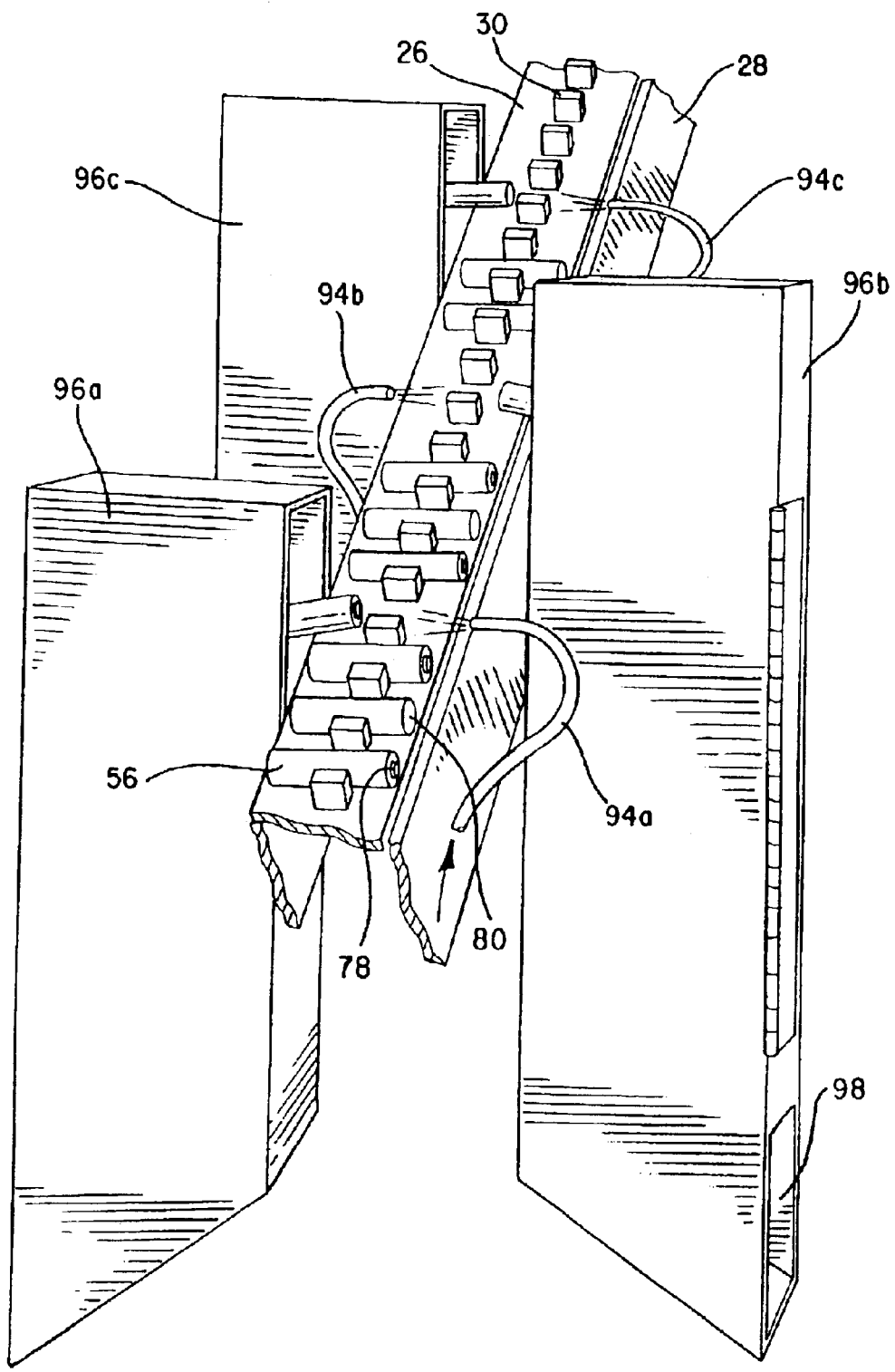
FIG. 4 shows a close-up perspective view of the sorting section according to the invention.
Figure 6:
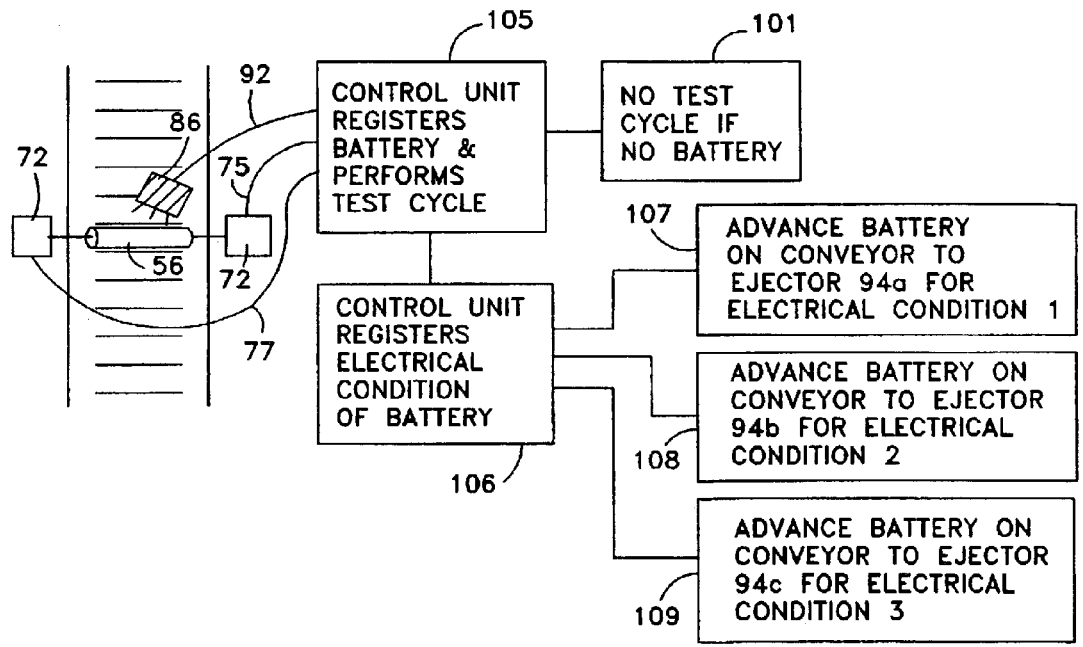
FIG. 6 shows a flow chart depicting the process of testing and sorting batteries according to the invention.

Referring now to FIG. 4, the sorting section will now be described in more detail. In the preferred embodiment, the sorting section is disposed along the length of the conveyor upstream from the testing section for ejecting the batteries from the conveyor according to the electrical condition of the batteries determined by the testing section. The sorting section includes a series of ejectors 94a, 94b, and 94c, disposed alongside the conveyor for ejecting batteries from the conveyor. Referring to FIGS. 4 and 6, control unit 24 receives a proximity signal through wire 92 from proximity detector 86 when a battery enters the testing section. This signals the control unit to perform a testing cycle 105 on the battery and receive the test signal from probe assembly 72 through wires 75 and 77. The control unit then registers the electrical condition of the battery being tested 106 and classifies the battery as having electrical condition 1, electrical condition 2, or electrical condition 3. If a battery is not detected by proximity detector 86, the control unit will not perform a testing cycle and will continue to advance the conveyor 101 until a battery is detected. Each of electrical conditions 1, 2, and 3 being associated with one of ejectors 94a, 94b, and 94c for sorting the battery into a specific bin for a given electrical condition. Next, the control unit signals the conveyor drive to advance the batteries on the conveyor a predetermined distance required to present the next battery on the conveyor belt 26 for testing. The location of the previously tested battery is stored, and that battery is advanced in steps until it is located adjacent to a specific ejector in the sorting section which will eject the battery based on its electrical condition. Once the battery is in position in front of the ejector, the control unit signals the ejector to eject the battery from the conveyor, 107, 108, 109. In the preferred embodiment, ejectors 94a, 94b, and 94c are air nozzles disposed alongside the conveyor for delivering a controlled burst of air across the conveyor belt at the battery to be ejected. Preferably, the air pressure is set at approximately 0.4+0.1/-0.0 Mpa. Once ejected, the batteries are received in one of chutes 96a, 96b, and 96c, which delivers the batteries to a collection bin. In order to break the fall of the battery and reduce the likelihood of damage to the batteries, each chute includes an angled bottom 98 with a pad on which the battery will land and then roll into the collection bin.

In operation, a battery is fed from feed tube 46 onto conveyor 26. Control unit 24 registers the position of the battery through sensors 58 and 59 to make sure that the battery is completely removed from feed tube 24. When the battery is properly in position, the control unit signals conveyor drive 36 to advance the conveyor and move the battery to the testing section. If the battery is not properly fed out of feed tube 46, through the interaction of sensors 58 and 59 as described above the control unit will signal the conveyor drive to stop. Once the battery enters the testing section, sensor 86 detects the presence of a battery adjacent to probe assembly 72. Upon detection of the battery by sensor 86, the control unit will signal the probe assembly to perform a testing cycle to register the electrical condition of the battery. If sensor 86 does not detect the presence of a battery in the probe assembly, no test cycle will be performed and the conveyor will simply be advanced until a battery enters the probe assembly for testing. After the control unit tests the battery and registers its electrical condition, the control unit advances the conveyor drive so that the battery is positioned across from one of the ejectors designated for ejecting a battery for a given electrical condition. Once the battery is in position across from the ejector, the control unit signals the ejector to deliver a controlled burst of air to push the battery off the conveyor and into one of the chutes for delivering the battery to a collection bin.

Thus, it can be seen that an advantageous construction can be had for an automatic battery tester and sorter wherein a simplified inclined conveyor advances batteries from a feeding section to a testing section, and to a sorting section where batteries are ejected according to their electrical condition.

While a preferred embodiment of the invention has been described using specific terms, such description is for illustrative purposes only, and it is to be understood that changes and variations may be made without departing from the spirit or scope of the following claims.

What is claimed is:

1. A battery testing and sorting apparatus for testing the electrical condition of a battery and sorting the battery according to its electrical condition, said apparatus comprising:
   a conveyor adapted for receiving batteries and moving the batteries for testing and sorting;
   a battery feeding section disposed along the length of said conveyor for positioning the battery laterally onto said conveyor so that terminals of the battery are in a horizontal orientation on the conveyor;
   at least one position sensor disposed along said conveyor for detecting proper lateral placement of the battery on said conveyor at said battery feeding section;
   a testing section disposed along the length of said conveyor following said battery feeding section for testing the electrical condition of the battery; and
   a sorting section disposed along the length of said conveyor following said testing section and operatively associated with said testing section for ejecting the battery from the conveyor according to the electrical condition of the battery determined by said testing section;
   whereby a battery testing and sorting apparatus is provided for continuously sorting large quantities of batteries into groups based on the electrical condition of the battery.

2. The apparatus of claim 1 including a control unit operatively associated with a conveyor drive for moving said conveyor to advance batteries for testing and sorting; said control unit receiving position signals from said at least one position sensor as to the battery's position on the conveyor before advancing said conveyor to receive another battery.

3. The apparatus of claim 2 including a battery feeder disposed alongside said conveyor for delivering batteries onto said conveyor; said at least one position sensor including a first feed sensor disposed above said conveyor adjacent said battery feeder, and a second feed sensor disposed alongside said conveyor across from said battery feeder for providing said position signals to said control unit to detect the position of the battery on said conveyor.

4. The apparatus of claim 3 wherein said first feed sensor and said second feed sensor are operatively associated with said control unit for controlling said conveyor drive; said control unit signaling said conveyor drive to advance the conveyor upon receiving a first position signal from said first feed sensor and a second position signal from said second feed sensor indicating that the battery is completely removed from said battery feeder and it is safe to advance the conveyor drive.

5. The apparatus of claim 1 wherein said conveyor includes a plurality of cleats extending outward from said conveyor; said cleats spaced apart to allow only a single battery to be received on said conveyor at said battery feeding section between any two of said cleats.

6. The apparatus of claim 5 including a cleat sensor disposed along said conveyor for sensing the passing of cleats and generating a cleat signal for each passing cleat; and a control unit for receiving said cleat signal from said cleat sensor for determining the spacing between said cleats; said control unit signaling a conveyor drive operatively associated with said conveyor to stop the advancement of the conveyor when the spacing between said cleats exceeds a designated distance so that the batteries are prevented from improperly feeding onto the conveyor or being improperly ejected from the conveyor.

7. The apparatus of claim 1 including a battery tester disposed at said testing section for contacting the battery and generating a test signal for the battery being tested; and a control unit receiving said test signal from said battery tester to determine the electrical condition of the battery; said control unit signaling a conveyor drive operatively associated with said conveyor to advance the battery on said conveyor to an ejector in said sorting section; said control unit signaling said ejector to eject the battery from the conveyor when the battery is in position for ejection.

8. The apparatus of claim 7 wherein said battery tester includes a probe assembly for contacting said terminals on the battery and generating said test signal; said probe assembly connected to said control unit for determining the battery's electrical condition.

9. The apparatus of claim 8 wherein said probe assembly includes a first probe disposed adjacent said conveyor for contacting one terminal of the battery, and a second probe disposed adjacent said conveyor for contacting an opposite terminal of the battery to generate said test signal and allow said control unit to read the electrical condition of the battery; said control unit reading the battery's electrical condition without deference to the horizontal orientation of the positive terminal and negative terminal of the battery on the conveyor.

10. The apparatus of claim 8 including a proximity detector for detecting the presence of a battery in said testing section; said control unit receiving a proximity signal from said proximity detector registering the presence of a battery in said testing section; said control unit signaling said probe assembly to test the battery upon receiving said proximity signal.

11. The apparatus of claim 1 including an ejector disposed along said conveyor at said sorting section for ejecting batteries from the conveyor based on the electrical condition of the battery determined at said testing section.

12. The apparatus of claim 11 including a control unit receiving a test signal from said testing section and registering the electrical condition of the battery being tested; said control unit signaling a conveyor drive operatively associated with said conveyor to advance the batteries on said conveyor to an ejector in said sorting section; said control unit signaling said ejector to eject the battery from said conveyor when the battery is in position for ejection.

13. The apparatus of claim 12 wherein said ejector includes an air nozzle disposed alongside said conveyor for delivering a controlled burst of air across said conveyor at the battery to eject the battery from said conveyor.

14. The apparatus of claim 13 including at least one chute for receiving a battery ejected from said conveyor and delivering the battery to a collection bin; said chute including an angled bottom portion carrying a pad to cushion the fall of the battery down the chute and prevent damage to the battery.

15. A battery testing and sorting apparatus for testing the electrical condition of batteries and sorting the batteries according to their electrical condition, said apparatus comprising:
   a conveyor having a conveyor drive for moving the conveyor to receive, test and sort batteries;
   a battery feeding section disposed along the length of said conveyor having a battery feeder for positioning batteries between cleats extending outward from said conveyor so that terminals of the batteries are in a horizontal orientation on the conveyor; said cleats spaced apart to allow only a single battery to be received on said conveyor at said battery feeding section between any two of said cleats;

a cleat sensor disposed along said conveyor for sensing the passing of cleats and generating a cleat signal for each passing cleat;

a control unit operatively associated with said cleat sensor for receiving said cleat signal from said cleat sensor for determining the interval between said cleats; said control unit signaling said conveyor drive to stop the advancement of the conveyor when the interval between said cleats exceeds a designated interval so that the batteries are prevented from improperly feeding onto the conveyor or being improperly ejected from the conveyor;

a testing section disposed along the length of said conveyor following said battery feeding section having a battery tester for testing the electrical condition of the batteries; and a sorting section disposed along the length of said conveyor following said testing section having an ejector for ejecting the batteries from said conveyor according to the electrical condition of the batteries.

16. The apparatus of claim 15 including at least one position sensor for detecting the position of the battery on said conveyor at said battery feeding section; said control unit receiving position signals from said position sensors as to the battery's position on the conveyor before advancing said conveyor to receive another battery.

17. The apparatus of claim 16 wherein said battery feeder is disposed alongside said conveyor for delivering batteries onto said conveyor; said at least one position sensor including a first feed sensor disposed above said conveyor adjacent said battery feeder, and a second feed sensor disposed alongside said conveyor across from said battery feeder for providing said position signals to said control unit to detect the position of the battery on said conveyor.

18. The apparatus of claim 17 wherein said first feed sensor and said second feed sensor are operatively associated with said control unit for controlling said conveyor drive; said control unit signaling said conveyor drive to advance the conveyor upon receiving a first position signal from said first feed sensor and a second position signal from said second feed sensor indicating that the battery is completely removed from said battery feeder and it is safe to advance the conveyor drive.

19. The apparatus of claim 15 wherein said battery tester is disposed alongside said conveyor at said testing section for contacting said terminals of the battery and generating a test signal for the battery being tested; said control unit receiving said test signal from said battery tester to determine the electrical condition of the battery; said control unit signaling said conveyor drive to advance the battery on said conveyor to an ejector in said sorting section; said control unit signaling said ejector to eject the battery from the conveyor when the battery is in position for ejection.

20. The apparatus of claim 19 wherein said battery tester includes a probe assembly for contacting said terminals on the battery and generating said test signal; said probe assembly connected to said control unit for determining the battery's electrical condition.

21. The apparatus of claim 20 wherein said probe assembly includes a first probe disposed adjacent said conveyor for contacting one terminal of the battery, and a second probe disposed adjacent said conveyor for contacting an opposite terminal of the battery to generate said test signal and allow said control unit to read the electrical condition of the battery; said control unit reading the battery's electrical condition without deference to the horizontal orientation of the positive terminal and negative terminal of the battery on the conveyor.

22. The apparatus of claim 20 including a proximity detector for detecting the presence of a battery in said testing section; said control unit receiving a proximity signal from said proximity detector registering the presence of a battery in said testing section; said control unit signaling said probe assembly to test the battery upon receiving said proximity signal.

23. The apparatus of claim 15 wherein said ejector is disposed along said conveyor at said sorting section for ejecting batteries from the conveyor based on the electrical condition of the battery determined at said testing section.

24. The apparatus of claim 23 wherein said control unit receives a test signal from said testing section and registering the electrical condition of the battery being tested; said control unit signaling said conveyor drive to advance the batteries on said conveyor to an ejector in said sorting section; said control unit signaling said ejector to eject the battery from said conveyor when the battery is in position for ejection.

25. The apparatus of claim 24 wherein said ejector includes an air nozzle disposed alongside said conveyor for delivering a controlled burst of air across said conveyor at the battery to eject the battery from said conveyor.

26. The apparatus of claim 25 including at least one chute for receiving a battery ejected from said conveyor and delivering the battery to a collection bin; said chute including an angled bottom portion carrying a pad to cushion the fall of the battery down the chute and prevent damage to the battery.

27. A method for testing the electrical condition of a battery and sorting the battery according to its electrical condition comprising the steps of:

providing a conveyor having a conveyor drive for moving the conveyor to receive, test and sort batteries;

providing a battery feeder operatively associated with said conveyor;

feeding a battery laterally onto said conveyor from said battery feeder so that terminals of the battery are in a horizontal orientation on the conveyor;

sensing the position of the battery on the conveyor at said battery feeder for proper alignment prior to advancing the conveyor;

providing a battery tester of along said conveyor following said battery feeder;

advancing the battery on said conveyor from said battery feeder to said battery tester for testing;

testing the electrical condition of the battery on said conveyor to determine the electrical condition of the battery;

providing at least one ejector along said conveyor following said battery tester for sorting batteries;

advancing the battery on said conveyor from said battery tester to said ejector; and ejecting the battery from said conveyor into a grouping based on the battery's electrical condition determined by said battery tester;

whereby a method is provided for testing and sorting large quantities of batteries into groups based on the electrical condition of the batteries.

28. The method of claim 27 including the step of signaling a control unit to advance the conveyor drive to move the battery on said conveyor to said battery tester when the battery is properly aligned on said conveyor.

29. The method of claim 27 including the step of signaling a control unit to conduct a battery test cycle only when a battery is detected by a proximity detector as present in said testing section.

30. The method of claim 29 including the step of registering the electrical condition of the battery determined by said test cycle and associating the electrical condition with one of said ejectors, then advancing the battery on the conveyor to said ejector associated with the battery's electrical condition to eject the battery from the conveyor.

\* \* \* \* \*